US010138158B2

(12) United States Patent
Ding et al.

(10) Patent No.: US 10,138,158 B2
(45) Date of Patent: *Nov. 27, 2018

(54) COATED ARTICLE HAVING LOW-E COATING WITH IR REFLECTING LAYER(S) AND HIGH INDEX NITRIDED DIELECTRIC LAYERS

(71) Applicant: Guardian Industries Corp., Auburn Hills, MI (US)

(72) Inventors: Guowen Ding, San Jose, CA (US); Guizhen Zhang, San Jose, CA (US); Daniel Schweigert, San Jose, CA (US); Daniel Lee, San Jose, CA (US); Scott Jewhurst, San Jose, CA (US); Cesar Clavero, San Jose, CA (US); Minh Le, San Jose, CA (US); Brent Boyce, Novi, MI (US)

(73) Assignee: Guardian Glass, LLC, Auburn Hills, MI (US)

( * ) Notice: Subject to any disclaimer, the term of this patent is extended or adjusted under 35 U.S.C. 154(b) by 75 days.

This patent is subject to a terminal disclaimer.

(21) Appl. No.: 15/455,163

(22) Filed: Mar. 10, 2017

(65) Prior Publication Data

US 2018/0257979 A1 Sep. 13, 2018

(51) Int. Cl.
*B32B 15/04* (2006.01)
*B32B 17/06* (2006.01)
(Continued)

(52) U.S. Cl.
CPC ........ *C03C 17/3435* (2013.01); *C03C 17/002* (2013.01); *C23C 14/0641* (2013.01);
(Continued)

(58) Field of Classification Search
USPC ................ 428/428, 432, 434, 688, 701, 702
See application file for complete search history.

(56) References Cited

U.S. PATENT DOCUMENTS

| 4,883,721 A | 11/1989 | Nalepka et al. |
| 5,110,637 A * | 5/1992 | Ando ................. C03C 17/23 |
| | | 428/34 |

(Continued)

FOREIGN PATENT DOCUMENTS

| EP | 2 746 236 | 6/2014 |
| WO | WO 2012/052315 | 4/2012 |

OTHER PUBLICATIONS

U.S. Appl. No. 15/448,620, filed Mar. 3, 2017; Saraf et al.
U.S. Appl. No. 15/448,629, filed Mar. 3, 2017; Ding et al.
U.S. Appl. No. 15/448,739, filed Mar. 3, 2017; Zhang et al.

*Primary Examiner* — Lauren R Colgan
(74) *Attorney, Agent, or Firm* — Nixon & Vanderhye P.C.

(57) ABSTRACT

A coated article includes a low emissivity (low-E) coating having at least one infrared (IR) reflecting layer of a material such as silver, gold, or the like, and a plurality of high refractive index dielectric layers of or including a nitride of Zr and Al. In certain example embodiments, the high refractive index dielectric layers of or including a nitride of Zr and Al may be amorphous or substantially amorphous so as to allow the low-E coating to better withstand optional heat treatment (HT) such as thermal tempering. In certain example embodiments, the low-E coating may be used in applications such as monolithic or insulating glass (IG) window unit, vehicle windows, of the like.

21 Claims, 2 Drawing Sheets

(51) Int. Cl.
*C03C 17/34* (2006.01)
*C03C 17/00* (2006.01)
*C23C 14/34* (2006.01)
*C23C 14/08* (2006.01)
*C23C 14/06* (2006.01)

(52) U.S. Cl.
CPC ............ *C23C 14/086* (2013.01); *C23C 14/34* (2013.01); *C03C 2217/216* (2013.01); *C03C 2217/281* (2013.01); *C03C 2217/29* (2013.01); *C03C 2217/70* (2013.01); *C03C 2218/154* (2013.01)

(56) References Cited

U.S. PATENT DOCUMENTS

| | | | |
|---|---|---|---|
| 5,344,718 A | 9/1994 | Hartig et al. | |
| 6,210,784 B1 | 4/2001 | Rondeau et al. | |
| 6,291,867 B1 * | 9/2001 | Wallace | H01L 21/28185 257/310 |
| 6,355,334 B1 | 3/2002 | Rondeau et al. | |
| 6,576,349 B2 | 6/2003 | Lingle et al. | |
| 6,589,658 B1 * | 7/2003 | Stachowiak | C03C 17/36 428/426 |
| 6,602,608 B2 | 8/2003 | Stachowiak | |
| 6,610,410 B2 | 8/2003 | Ebisawa et al. | |
| 6,830,817 B2 * | 12/2004 | Stachowiak | C03C 17/36 428/426 |
| 7,005,188 B2 | 2/2006 | Anderson et al. | |
| 7,081,301 B2 | 7/2006 | Stachowiak | |
| 7,153,578 B2 * | 12/2006 | Chonlannaitri | C03C 17/36 428/428 |
| 7,153,579 B2 | 12/2006 | Kriltz et al. | |
| 7,241,506 B2 | 7/2007 | Hartig | |
| 7,390,572 B2 * | 6/2008 | Butz | C03C 17/36 428/428 |
| 7,846,492 B2 * | 12/2010 | Veerasamy | C03C 17/34 427/162 |
| 7,892,662 B2 * | 2/2011 | Veerasamy | C03C 17/36 428/432 |
| 8,105,695 B2 * | 1/2012 | Depauw | C03C 17/36 428/432 |
| 8,557,391 B2 * | 10/2013 | Frank | C03C 17/36 428/434 |
| 8,940,400 B1 * | 1/2015 | Wuillaume | C03C 17/36 428/426 |
| 8,945,714 B2 | 2/2015 | Lao et al. | |
| 9,028,956 B2 | 5/2015 | Knoll et al. | |
| 9,028,983 B2 | 5/2015 | Imran et al. | |
| 9,052,456 B2 | 6/2015 | Hassan et al. | |
| 9,150,003 B2 * | 10/2015 | Dietrich | B32B 5/00 |
| 9,199,874 B2 | 12/2015 | Peter et al. | |
| 9,212,417 B2 | 12/2015 | Frank et al. | |
| 9,297,197 B2 | 3/2016 | Lao et al. | |
| 9,309,149 B2 * | 4/2016 | Ding | C03C 17/3639 |
| 9,315,414 B2 | 4/2016 | Hassan et al. | |
| 9,365,450 B2 | 6/2016 | Ding et al. | |
| 9,371,684 B2 | 6/2016 | Butz et al. | |
| 9,403,345 B2 | 8/2016 | Lao et al. | |
| 9,410,359 B2 | 8/2016 | Ding et al. | |
| 9,494,717 B2 | 11/2016 | Reymond et al. | |
| 9,499,437 B2 | 11/2016 | Imran et al. | |
| 9,518,319 B2 | 12/2016 | Ding et al. | |
| 9,546,108 B2 | 1/2017 | Rondeau et al. | |
| 9,556,070 B2 | 1/2017 | Wuillaume et al. | |
| 9,738,561 B2 * | 8/2017 | Butz | C03C 17/36 |
| 9,816,316 B2 * | 11/2017 | Lao | C03C 17/36 |
| 2007/0281171 A1 * | 12/2007 | Coster | B32B 17/10036 428/432 |
| 2010/0279144 A1 * | 11/2010 | Frank | C03C 17/36 428/623 |
| 2014/0198389 A1 | 7/2014 | Laurent et al. | |
| 2014/0362434 A1 | 12/2014 | Schmitz et al. | |
| 2015/0321950 A1 | 11/2015 | Fischer et al. | |
| 2016/0031750 A1 * | 2/2016 | Ridealgh | C03C 17/3435 428/336 |

* cited by examiner

COATED ARTICLE HAVING LOW-E COATING WITH IR REFLECTING LAYER(S) AND HIGH INDEX NITRIDED DIELECTRIC LAYERS

Example embodiments of this invention relate to a coated article including a low emissivity (low-E) coating having at least one infrared (IR) reflecting layer of a material such as silver, gold, or the like, and a plurality of high refractive index dielectric layers of or including a nitride of Zr and Al. In certain example embodiments, the high refractive index dielectric layers of or including a nitride of Zr and Al may be amorphous or substantially amorphous so as to allow the low-E coating to better withstand optional heat treatment (HT) such as thermal tempering. In certain example embodiments, the low-E coating may be used in applications such as monolithic or insulating glass (IG) window unit, vehicle windows, of the like.

BACKGROUND AND SUMMARY OF EXAMPLE EMBODIMENTS OF THE INVENTION

Coated articles are known in the art for use in window applications such as insulating glass (IG) window units, vehicle windows, monolithic windows, and/or the like.

Conventional low-E coatings are disclosed, for example and without limitation, in U.S. Pat. Nos. 6,576,349, 9,212,417, 9,297,197, 7,390,572, 7,153,579, and 9,403,345, the disclosures of which are hereby incorporated herein by reference.

Certain low-E coating utilize at least one transparent dielectric layer of titanium oxide (e.g., $TiO_2$), which has a high refractive index (n), for antireflection and/or coloration purposes. See for example U.S. Pat. Nos. 9,212,417, 9,297,197, 7,390,572, 7,153,579, and 9,403,345. Although high refractive index dielectric material $TiO_2$ is known and used in low-E coatings, $TiO_2$ has a very low sputter-deposition rate and is not thermally stable upon heat treatment such as thermal tempering of about 650 C for 8 minutes, due to film crystallization (or change in crystallinity) in as-deposited or post-tempering state, which may in turn induce thermal or lattice stress on adjacent layers in the film stack. Such stress can further cause change in physical or material properties of the stack and hence impact on the Ag layer, which results in deteriorated low E stack performance. The low sputter deposition rate of $TiO_2$ leads to significantly high costs associated with making low-E coatings including such layer (s).

Example embodiments of this invention solve these problems by providing a coated article including a low emissivity (low-E) coating having at least one infrared (IR) reflecting layer of a material such as silver, gold, or the like, and a plurality of high refractive index dielectric layers of or including a nitride of Zr and Al. In certain example embodiments, the high refractive index dielectric layers of or including a nitride of Zr and Al may be amorphous or substantially amorphous so as to allow the low-E coating to better withstand optional heat treatment (HT) such as thermal tempering. In certain example embodiments of this invention, the low-E coating includes a layer sequence of glass . . . ZrAlN/ZnO/Ag/contact/ZnO/ZrAlN . . . overcoat, where the ZnO inclusive layers may further contain Al or the like. It has been found that such a sequence advantageously provides for increased sputter deposition rates and thus lower cost, high transparency, good durability, good optical performance, and good thermal performance. In certain example embodiments, the low-E coating may be used in applications such as monolithic or insulating glass (IG) window unit, vehicle windows, of the like.

In an example embodiment of this invention, there is provided a coated article including a coating supported by a glass substrate, the coating comprising: a first high index dielectric layer comprising a nitride of Zr and Al on the glass substrate, wherein the first high index dielectric layer comprising the nitride of Zr and Al contains more Zr than Al; a first dielectric layer comprising zinc oxide on the glass substrate located over and directly contacting the first high index layer comprising the nitride of Zr and Al; a first infrared (IR) reflecting layer on the glass substrate, located over and directly contacting the first dielectric layer comprising zinc oxide; a first contact layer on the glass substrate located over and directly contacting the first IR reflecting layer; a second dielectric layer comprising zinc oxide on the glass substrate located over and directly contacting the first contact layer; a second high index dielectric layer comprising a nitride of Zr and Al on the glass substrate located over and directly contacting the second dielectric layer comprising zinc oxide, wherein the second high index dielectric layer comprising the nitride of Zr and Al contains more Zr than Al; and another dielectric layer on the glass substrate located over at least the first and second high index dielectric layers and the first IR reflecting layer.

DETAILED DESCRIPTION OF EXAMPLE EMBODIMENTS OF THE INVENTION

Figure 1:
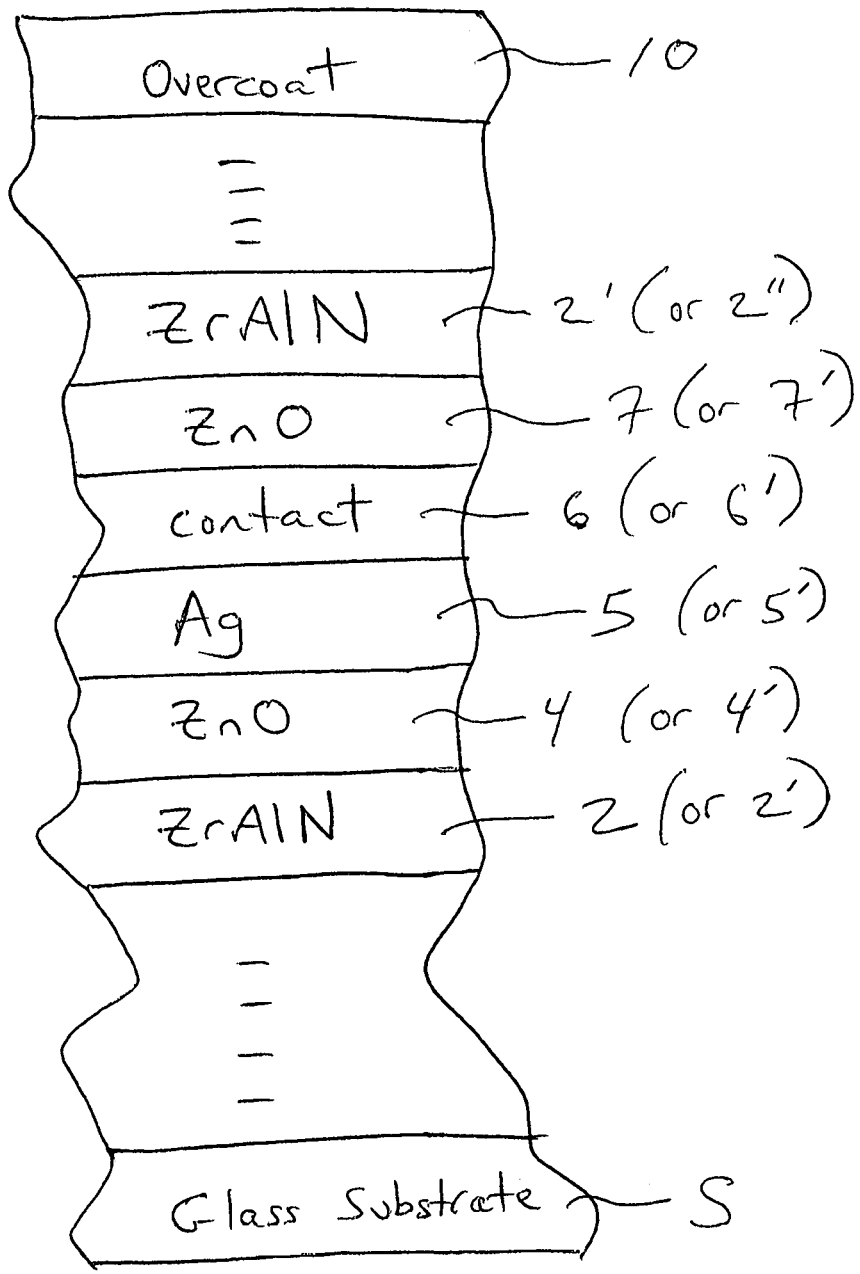
FIG. 1 is a cross sectional view of a layer sequence of a coated article according to an example embodiment of this invention.

Referring now to the drawings in which like reference numerals indicate like parts throughout the several views.

Coated articles herein may be used in applications such as monolithic windows, IG window units such as residential windows, patio doors, vehicle windows, and/or any other suitable application that includes single or multiple substrates such as glass substrates.

Example embodiments of this invention provide a coated article including a low emissivity (low-E) coating having at least one infrared (IR) reflecting layer 5, 5' of a material such as silver, gold, or the like, and a plurality of high refractive index dielectric layers 2, 2', 2" of or including a nitride of Zr and Al. In certain example embodiments, the high refractive index dielectric layers 2, 2', 2" of or including a nitride of Zr and Al may be amorphous or substantially amorphous so as to allow the low-E coating to better withstand optional heat treatment (HT) such as thermal tempering. In certain example embodiments of this invention, the low-E coating includes a layer sequence of glass . . . ZrAlN/ZnO/Ag/contact/ZnO/ZrAlN . . . overcoat (in various stoichiometries), where the ZnO inclusive layers 4, 4', 7, 7' may further contain Al or the like. In the FIG. 2 embodiment, two of these layer sequences are provided, one for each of the IR reflecting layers. It has been found that such a sequence advantageously provides for increased sputter deposition rates and thus lower cost, high transparency, good durability, good optical performance, and good thermal performance. In certain example embodiments, the low-E coating may be used in applications such as monolithic or insulating glass (IG) window unit, vehicle windows, of the like.

For example, high index transparent dielectric layers 2, 2', and 2" may each be of or include ZrSiN and/or ZrSiAlN (in various stoichiometries). The high index layers 2, 2' and/or 2" of or including ZrSiN and/or ZrSiAlN may be amorphous or substantially amorphous, with the amorphous aspect helping the low-E coating to better withstand optional heat treatment (HT) such as thermal tempering. The high index layers 2, 2' and/or 2" of or including ZrSiN and/or ZrSiAlN have a faster sputtering rate than high index material $TiO_2$ at like thickness, and thus lead to lower production costs. The high index layers 2, 2' and/or 2" of or including ZrSiN and/or ZrSiAlN can also be sputter-deposited in an amorphous or substantially amorphous manner, leading to improved thermal stability compared to high index material $TiO_2$.

The chemical representations herein where Zr is included are provided for purposes of simplicity and understanding, and are not necessarily stoichiometric. For example, ZrSiN does not mean that equal amounts of Zr, Si and N are provided. As another example, ZrSiAlN does not mean that equal amounts of Zr, Si, Al and N are provided. Instead, for example and without limitation, a ZrSiN layer may include more Zr than Si, and so forth. As another example, a ZrSiAlN layer may contain more Zr than Si, and more Zr than Al.

"Heat treatment" (HT) and like terms such as "heat treating" and "heat treated", such as thermal tempering, heat strengthening, and/or heat bending, as used herein means heat treating the glass substrate and coating thereon at temperature of at least 580 degrees C. for at least 5 minutes. An example heat treatment is heat treating at temperature of about 600-650 degrees C. for at least 8 minutes.

It has been found that adding Zr to SiAlN and SiN allows widening of its band-gap, and thus lowers considerably the optical absorption (k) while increasing refractive index (n). These materials have also been found to be heat stable (e.g., the variation of refractive index n may be low due to HT such as thermal tempering at about 650° C.). Thus, the addition of Zr to SiAlN and SiN provides for an improvement because it causes the resulting layer to have a higher refractive index and lower absorption coefficient. In certain example embodiments of this invention, sufficient Zr is provided in layer(s) 2, 2', and/or 2" of or including ZrSiN and/or ZrSiAlN so that layer(s) 2, 2' and/or 2" have a high refractive index (n) of at least 2.21, more preferably of at least 2.25, even more preferably of at least 2.30 (at 550 nm).

An example metal content of a ZrSiAlN layer 2, 2' and/or 2" is as follows with respect to atomic ratio: Zr:Si:Al→62.6:31.3:6.7:30.7. In other words, Zr makes up 62.6%, Si makes up 6.7%, and Al makes up 30.7% of the metal content of the nitrided layer 2, 2', 2" in terms of atomic %. In certain example embodiments of this invention, metal content of the ZrSiN and/or ZrSiAlN dielectric layer(s) 2, 2' and 2" may contain: (i) from 30-80% Zr, more preferably from 35-75% Zr, even more preferably from 55-70% Zr (atomic %); (ii) from 0-50% Si, more preferably from 3-25% Si, even more preferably from 3-15% Si (atomic %); and (iii) from 10-60% Al, more preferably from 15-50% Al, even more preferably from 20-40% Al, and most preferably from 25-36% Al (atomic %). Note that Si is considered a metal herein. In certain example embodiments, layer(s) 2, 2', 2" contain more Zr than Si, and more Zr than Al, in terms of atomic percentage. In certain example embodiments, Zr has the highest metal content of any metal in layer(s) 2, 2', 2" and/or Al has the second highest metal content of any metal in layer(s) 2, 2', 2". In certain example embodiments, layers 2, 2', 2" contain at least twice as much Zr as Si, more preferably at least three times as much Zr as Si, even more preferably at least four times as much Zr as Si, and most preferably at least five times as much Zr as Si (in terms of atomic %). In certain example embodiments, layer(s)2, 2', 2" contain at least 1.2 times as much Zr as Al, more preferably at least 1.4 times as much Zr as Al, and most preferably at least 1.7 times as much Zr as Al (in terms of atomic %). For example, when layer 2, 2' and/or 2" contains 31% Al and 63% Zr, it contains 2.032 times as much Zr as Al (i.e., 63/31=2.032).

The metal content of the ZrSiN and/or ZrSiAlN dielectric layer(s) 2, 2', 2" is preferably free of, or substantially free of, Ti and/or Nb. Layer(s) 2, 2', 2" may contain from 0-10% of Ti, more preferably from 0-5% Ti, and most preferably from 0-2% of Ti (atomic %), and/or from 0-10% of Nb, more preferably from 0-5% Nb, and most preferably from 0-2% of Nb.

While oxygen is not preferred in high index ZrSiN and/or ZrSiAlN dielectric layers 2, 2', 2" discussed herein, it is possible that these layers may contain a small amount of oxygen, especially in view of crosstalk from an adjacent zinc oxide layer also be sputter deposited. For example, high index ZrSiN and/or ZrSiAlN dielectric layers 2, 2', 2" may contain from 0-10% oxygen more preferably from 0-5% oxygen, and most preferably from 0-4% oxygen (atomic %).

Figure 2:
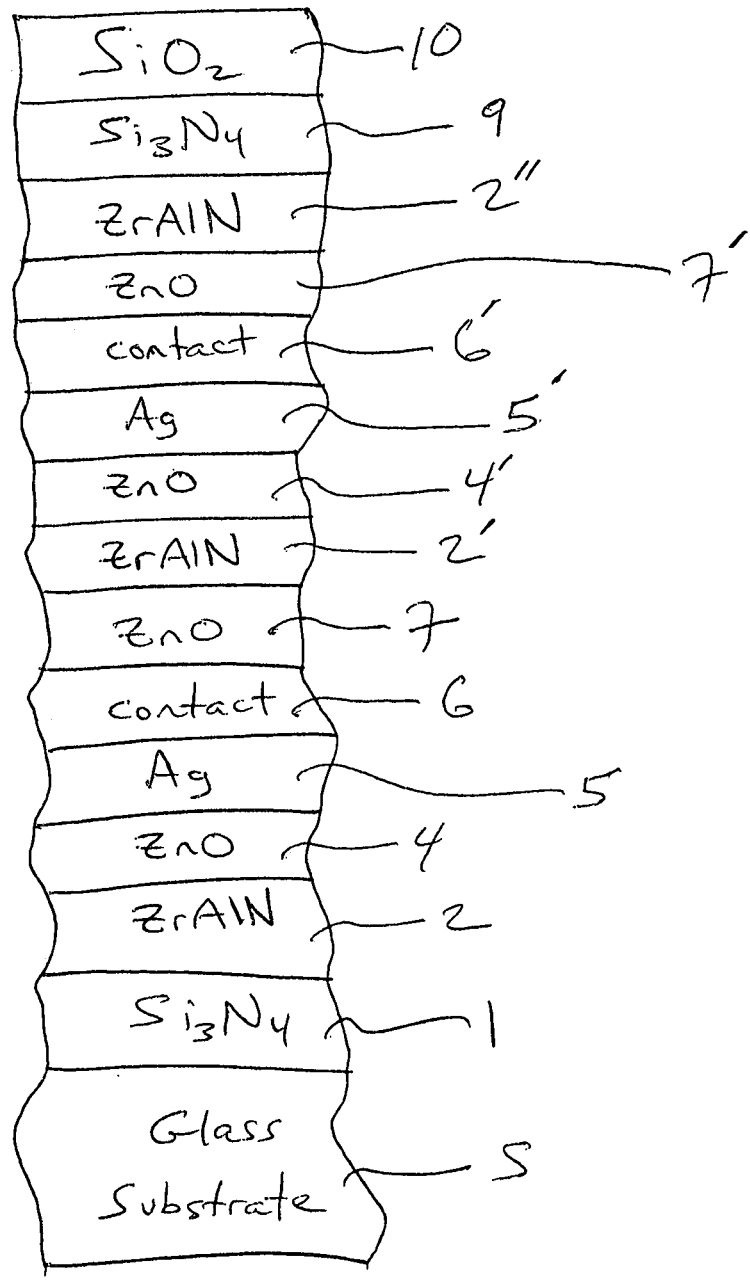
FIG. 2 is a cross sectional view of a coated article according to an example embodiment of this invention, including the layer sequence shown in FIG. 1.

Fig. is a cross sectional view of a layer sequence of a coated article according to an example embodiment of this invention, and FIG. 2 is a cross sectional view of a coated article according to an example embodiment of this invention including two of the layer sequences shown in FIG. 1.

Referring to FIG. 1, the coated article includes glass substrate S and a layer sequence of or including high index transparent ZrSiN and/or ZrSiAlN dielectric layer 2 (or 2'), transparent dielectric layer 4 (or 4') of or including zinc oxide which may be doped with from 1-10% Al (atomic %) and which may optionally include tin, IR reflecting layer 5 (or 5') of or including silver, gold, or the like, contact layer 6 (or 6') of or including a material such as NiCr, $NiCrO_x$, $NiCrMoO_x$, NiCrMo, or $NiTiNbO_x$, transparent dielectric layer 7 (or 7') of or including zinc oxide which may be doped with from 1-10% Al (atomic %) and which may optionally include tin, and another high index transparent ZrSiN and/or ZrSiAlN dielectric layer 2' (or 2"). One or more layers may be provided over the layer sequence described above, such as including an overcoat 10 of or including silicon nitride, silicon oxynitride, and/or silicon oxide (e.g., $SiO_2$). One such sequence may be provided in a single silver low-E coating, whereas one or more of such sequences may be provided in double or triple silver low-E coatings.

It has been found that a unique design in a double silver low-E coating for example, using a two block of sequence of glass . . . ZrAlN(or ZrAl alloy)/ZnAlO/Ag/contact/ZnAlO/ZrAlN(or ZrAl alloy) . . . overcoat, provides numerous advantages. ZrSiAlN may be used instead of ZrAlN in certain embodiments for layers 2, 2' and/or 2". This layer stack sequence provides for excellent substantially neutral color, high transparency, high throughput, long queue time and thus good durability, and low cost. Such coatings may be used to achieve excellent optical and thermal performance of low-E IG window units. In addition, in certain example embodiments, no titanium oxide based low deposition-rate material is used for high index layers in this design. Since the deposition rate of ZrAlN for instance is much faster than those of Ti based high index oxides, and even faster than silicon nitride sputter deposition rates, this design provides a benefit of increased throughput, and the deposition time on dielectric layers may be reduced by up to 40% so that the throughput is greatly benefitted.

Layers in the FIG. 1 sequence are important. Below the IR reflecting layer, ZrAlN and ZrSiAlN provide for a high index material, fast deposition rate, and low cost. Above the IR reflecting layer, without the ZrAlN or ZrSiAlN, the overall performance desired is not achieved because of the high index feature provided by this material(s). Moreover, zinc oxide inclusive layer 7 (or 7') is important, because if ZrAlN or ZrSiAlN is directly deposited to contact the contact layer 6 (or 6') of material such as NiTiNb or an oxide thereof, poor transmission has been found to result. In addition, such design showed excellent queue time of low-E stack, where queue time is the coating being exposed to ambient condition (after sputter depositing the coating) until the film is subject to optional HT such as thermal tempering. In particular, the haze value does not significantly change during this time and remains at low levels such as about 0.2 or less.

FIG. 2 is a cross sectional view of a coated article according to an example embodiment of this invention including two of the layer sequences shown in FIG. 1 in a double silver low-E coating. The coated article of FIG. 2 includes glass substrate S (e.g., clear, green, bronze, or blue-green glass substrate from about 1.0 to 10.0 mm thick, more preferably from about 1.0 mm to 6.0 mm thick), and a multi-layer coating (or layer system) provided on the substrate S either directly or indirectly. The example low-E coating according to the FIG. 2 embodiment may include an optional medium index layer 1 of or including a material such as silicon nitride (e.g., $Si_3N_4$) and/or silicon oxynitride, high index transparent ZrSiN and/or ZrSiAlN dielectric layer 2, transparent dielectric layer 4 of or including zinc oxide which may be doped with from 1-10% Al (atomic %) and which may optionally include tin, IR reflecting layer 5 of or including silver, gold, or the like, contact layer 6 of or including a material such as NiCr, $NiCrO_x$, $NiCrMoO_x$, NiCrMo, or $NiTiNbO_x$, transparent dielectric layer 7 of or including zinc oxide which may be doped with from 1-10% Al (atomic %) and which may optionally include tin, another high index transparent ZrSiN and/or ZrSiAlN dielectric layer 2', transparent dielectric layer 4' of or including zinc oxide which may be doped with from 1-10% Al (atomic %) and which may optionally include tin, another IR reflecting layer 5' of or including silver, gold, or the like, another contact layer 6' of or including a material such as NiCr, $NiCrO_x$, $NiCrMoO_x$, NiCrMo, or $NiTiNbO_x$, another transparent dielectric layer 7' of or including zinc oxide which may be doped with from 1-10% Al (atomic %) and which may optionally include tin, yet another high index transparent ZrSiN and/or ZrSiAlN dielectric layer 2", optional medium index layer 9 of or including material such as silicon nitride, silicon oxynitride, or zinc oxide, and overcoat 10 of or including material such as silicon nitride, silicon oxynitride, or silicon oxide. The silicon nitride layers 1, 9 may further include Al, oxygen, or the like, and the zinc oxide based layers 4, 4', 7, 7' may also include tin and/or aluminum. Other layers and/or materials may also be provided in the coating in certain example embodiments of this invention, and it is also possible that certain layers may be removed or split in certain example instances. Moreover, one or more of the layers discussed above may be doped with other materials in certain example embodiments of this invention. This invention is not limited to the layer stack shown in FIG. 2, as the FIG. 2 stack is provided for purposes of example only in order to illustrate an example location(s) for the layer sequence shown in FIG. 1.

In monolithic instances, the coated article includes only one substrate such as glass substrate S (see FIGS. 1 and 2). However, monolithic coated articles herein may be used in devices such as IG window units for example. Typically, an IG window unit may include two or more spaced apart substrates with an air gap defined therebetween. Example IG window units are illustrated and described, for example, in U.S. Pat. Nos. 5,770,321, 5,800,933, 6,524,714, 6,541,084 and U.S. 2003/0150711, the disclosures of which are all hereby incorporated herein by reference. For example, the coated glass substrate shown in FIG. 1 or FIG. 2 may be coupled to another glass substrate via spacer(s), sealant(s) or the like with a gap being defined therebetween in an IG window unit. In certain example instances, the coating may be provided on the side of the glass substrate S facing the gap, i.e., surface #2 or surface #3. In other example embodiments, the IG window unit may include additional glass sheets (e.g., the IG unit may include three spaced apart glass sheets instead of two).

Transparent dielectric zinc oxide inclusive layers 4, 4', 7, 7' may be of or include zinc oxide (e.g., ZnO), zinc stannate, or other suitable material. The zinc oxide may contain other materials as well such as Al (e.g., to form $ZnAlO_x$) or Sn in certain example embodiments. For example, in certain example embodiments of this invention, any of these layers may be doped with from about 1 to 10% Al (or B), more preferably from about 1 to 5% Al (or B), and most preferably about 2 to 4% Al (or B).

Infrared (IR) reflecting layers 5, 5' are preferably substantially or entirely metallic and/or conductive, and may comprise or consist essentially of silver (Ag), gold, or any other suitable IR reflecting material. The silver of IR reflecting layers 5, 5' may be doped with other material(s), such as with Pd, Zn, or Cu, in certain example embodiments. IR reflecting layers 5, 5' helps allow the coating to have low-E and/or good solar control characteristics such as low emittance, low sheet resistance, and so forth. The IR reflecting layers may, however, be slightly oxidized in certain embodiments of this invention.

Contact layers 6, 6' are located over and directly contacting the IR reflecting layers, and may be of or include an oxide of Ni and/or Cr in certain example embodiments. In certain example embodiments, contact layers 6, 6' may be of or include nickel (Ni) oxide, chromium/chrome (Cr) oxide, or a nickel alloy oxide such as nickel chrome oxide ($NiCrO_x$), or other suitable material(s) such as $NiCrMoO_x$, NiCrMo, Ti, $NiTiNbO_x$, $TiO_x$, metallic NiCr, or the like. Contact layers 6, 6' may or may not be oxidation graded in different embodiments of this invention. Oxidation grading means that the degree of oxidation in the layer changes through the thickness of the layer so that for example a contact layer may be graded so as to be less oxidized at the contact interface with the immediately adjacent IR reflecting layer than at a portion of the contact layer further or more/most distant from the immediately adjacent IR reflecting layer. Contact layers 6, 6' may or may not be continuous in different embodiments of this invention across the entire IR reflecting layer 4.

Other layer(s) below or above the illustrated FIG. 2 coating may also be provided. Thus, while the layer system or coating is "on" or "supported by" substrate S (directly or indirectly), other layer(s) may be provided therebetween. Thus, for example, the coating of FIG. 2 may be considered "on" and "supported by" the substrate S even if other layer(s) are provided between layer 1 and substrate S. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention.

While various thicknesses may be used in different embodiments of this invention, example thicknesses and materials for the respective layers on the glass substrate S in the FIG. 2 embodiment may be as follows, from the glass substrate outwardly (e.g., the Al content in the zinc oxide and silicon nitride layers may be from about 1-10%, more preferably from about 1-5% in certain example instances). Thickness are in units of angstroms (Å).

TABLE 1

(Example Materials/Thicknesses; FIG. 2 Embodiment)

| Layer<br>Glass Substrate | Preferred Range (Å) | More Preferred (Å) | Example (Å) |
|---|---|---|---|
| $Si_xN_y$ (layer 1) | 40-300 Å | 50-170 Å | 70-130 Å |
| ZrAlN or ZrSiAlN (layer 2) | 50-500 Å | 60-350 Å | 80-300 Å |
| ZnAlO (layer 4) | 30-250 Å | 40-180 Å | 40-100 Å |
| Ag (layer 5) | 40-160 Å | 65-125 Å | 110 Å |
| Contact (layer 6) | 10-70 Å | 20-45 Å | 25-35 Å |
| ZnAlO (layer 7) | 30-250 Å | 40-180 Å | 40-100 Å |
| ZrAlN or ZrSiAlN (layer 2') | 50-500 Å | 60-350 Å | 80-300 Å |
| ZnAlO (layer 4') | 30-250 Å | 40-180 Å | 40-100 Å |
| Ag (layer 5') | 40-160 Å | 65-125 Å | 110 Å |
| Contact (layer 6') | 10-70 Å | 20-45 Å | 25-35 Å |
| ZnAlO (layer 7') | 30-250 Å | 40-180 Å | 40-100 Å |
| ZrAlN or ZrSiAlN (layer 2") | 50-500 Å | 60-350 Å | 80-300 Å |
| $Si_xN_y$ (layer 9) | 50-400 Å | 100-300 Å | 140-240 Å |
| $SiO_2$ (layer 10) | 50-600 Å | 100-500 Å | 200-400 Å |

In certain example embodiments of this invention, coated articles herein (e.g., see FIG. 2) may have the following low-E (low emissivity), solar and/or optical characteristics set forth in Table 2 when measured monolithically.

TABLE 2

Low-E/Solar Characteristics (Monolithic)

| Characteristic | General | More Preferred | Most Preferred |
|---|---|---|---|
| $R_s$ (ohms/sq.): | <=11.0 | <=10 | <=9 |
| $E_n$: | <=0.2 | <=0.15 | <=0.10 |
| $T_{vis}$ (%): | >=50 | >=60 | >=70 (or >=80%) |
| SHGC (%): | >=40 | >=50 | >=55 |

In an example embodiment of this invention, there is provided a coated article including a coating supported by a glass substrate, the coating comprising: a first high index dielectric layer comprising a nitride of Zr and Al on the glass substrate, wherein the first high index dielectric layer comprising the nitride of Zr and Al contains more Zr than Al; a first dielectric layer comprising zinc oxide on the glass substrate located over and directly contacting the first high index layer comprising the nitride of Zr and Al; a first infrared (IR) reflecting layer on the glass substrate, located over and directly contacting the first dielectric layer comprising zinc oxide; a first contact layer on the glass substrate located over and directly contacting the first IR reflecting layer; a second dielectric layer comprising zinc oxide on the glass substrate located over and directly contacting the first contact layer; a second high index dielectric layer comprising a nitride of Zr and Al on the glass substrate located over and directly contacting the second dielectric layer comprising zinc oxide, wherein the second high index dielectric layer comprising the nitride of Zr and Al contains more Zr than Al; and another dielectric layer on the glass substrate located over at least the first and second high index dielectric layers and the first IR reflecting layer.

In the coated article of the immediately preceding paragraph, each of the first and second high index dielectric layers may have a refractive index (n) of at least 2.21 at 550 nm, more preferably of at least 2.25 at 550 nm.

In the coated article of any of the preceding two paragraphs, at least one of the first and second high index dielectric layers may further comprise Si.

In the coated article of any of the preceding three paragraphs, metal content of each of the first and second high index dielectric layers may comprise from 30-80% Zr and from 10-60% Al, more preferably from 35-75% Zr and from 15-50% Al, and most preferably from 55-70% Zr and from 20-40% Al (atomic %).

In the coated article of any of the preceding four paragraphs, metal content of at least one of the first and second high index dielectric layers may comprise from 3-25% Si, more preferably from 3-15% Si (atomic %).

In the coated article of any of the preceding five paragraphs, metal content of each of the first and second high index dielectric layers may comprise at least twice as much Zr as Si, more preferably at least three or four times as much Zr as Si.

In the coated article of any of the preceding six paragraphs, metal content of each of the first and second high index dielectric layers may comprise at least 1.2 times as much Zr as Al, more preferably at least 1.4 times as much Zr as Al.

In the coated article of any of the preceding seven paragraphs, the coating may be a low-E coating having a normal emissivity ($E_n$) of no greater than 0.2, more preferably of no greater than 0.10.

In the coated article of any of the preceding eight paragraphs, each of the first and second high index dielectric layers may be amorphous or substantially amorphous.

In the coated article of any of the preceding nine paragraphs, the first IR reflecting layer may comprises silver, and an optional second IR reflecting layer may also comprise silver.

In the coated article of any of the preceding ten paragraphs, the coating may further comprise a layer comprising silicon nitride located between the glass substrate and the first high index dielectric layer.

In the coated article of any of the preceding eleven paragraphs, the coated article may be thermally tempered.

In the coated article of any of the preceding twelve paragraphs, the coated article may have a visible transmission of at least 50%, more preferably of at least 60%, even more preferably of at least 70%, and even more preferably of at least 80%.

In the coated article of any of the preceding thirteen paragraphs, the first contact layer may comprises Ni and Cr.

In the coated article of any of the preceding fourteen paragraphs, the coating may further comprise: a third dielectric layer comprising zinc oxide on the glass substrate located over at least the a second high index dielectric layer comprising a nitride of Zr and Al; a second infrared (IR) reflecting layer on the glass substrate, located over and directly contacting the third dielectric layer comprising zinc oxide; a second contact layer on the glass substrate located over and directly contacting the second IR reflecting layer; a fourth dielectric layer comprising zinc oxide on the glass substrate located over and directly contacting the second contact layer; a third high index dielectric layer comprising a nitride of Zr and Al on the glass substrate located over and directly contacting the fourth dielectric layer comprising zinc oxide, wherein the third high index dielectric layer comprising the nitride of Zr and Al contains more Zr than Al; and wherein said another dielectric layer is located over at least the third high index dielectric layer.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A coated article including a coating supported by a glass substrate, the coating comprising:
    a first high index dielectric layer comprising a nitride of Zr and Al on the glass substrate, wherein the first high index dielectric layer comprising the nitride of Zr and Al contains more Zr than Al;
    a first dielectric layer comprising zinc oxide on the glass substrate located over and directly contacting the first high index layer comprising the nitride of Zr and Al;
    a first infrared (IR) reflecting layer on the glass substrate, located over and directly contacting the first dielectric layer comprising zinc oxide;
    a first contact layer on the glass substrate located over and directly contacting the first IR reflecting layer;
    a second dielectric layer comprising zinc oxide on the glass substrate located over and directly contacting the first contact layer;
    a second high index dielectric layer comprising a nitride of Zr and Al on the glass substrate located over and directly contacting the second dielectric layer comprising zinc oxide, wherein the second high index dielectric layer comprising the nitride of Zr and Al contains more Zr than Al; and
    another dielectric layer on the glass substrate located over at least the first and second high index dielectric layers and the first IR reflecting layer, and wherein at least one of the first and second high dielectric layers further comprises Si.

2. The coated article of claim 1, wherein each of the first and second high index dielectric layers has a refractive index (n) of at least 2.21 at 550 nm.

3. The coated article of claim 1, wherein each of the first and second high index dielectric layers has a refractive index (n) of at least 2.25 at 550 nm.

4. The coated article of claim 1, wherein metal content of each of the first and second high index dielectric layers comprises from 30-80% Zr and from 10-60% Al (atomic %).

5. The coated article of claim 1, wherein metal content of each of the first and second high index dielectric layers comprises from 35-75% Zr and from 15-50% Al (atomic %).

6. The coated article of claim 1, wherein metal content of each of the first and second high index dielectric layers comprises from 55-70% Zr and from 20-40% Al (atomic %).

7. The coated article of claim 1, wherein metal content of at least one of the first and second high index dielectric layers comprises from 3-25% Si (atomic %).

8. The coated article of claim 1, wherein metal content of at least one of the first and second high index dielectric layers comprises from 3-15% Si (atomic %).

9. The coated article of claim 1, wherein metal content of each of the first and second high index dielectric layers comprises at least twice as much Zr as Si.

10. The coated article of claim 1, wherein metal content of each of the first and second high index dielectric layers comprises at least four times as much Zr as Si.

11. The coated article of claim 1, wherein metal content of each of the first and second high index dielectric layers comprises at least 1.2 times as much Zr as Al (atomic %).

12. The coated article of claim 1, wherein metal content of each of the first and second high index dielectric layers comprises at least 1.4 times as much Zr as Al.

13. The coated article of claim 1, wherein the coating is a low-E coating and has a normal emissivity (En) of no greater than 0.2.

14. The coated article of claim 1, wherein the coating is a low-E coating and has a normal emissivity (En) of no greater than 0.10.

15. The coated article of claim 1, wherein each of the first and second high index dielectric layers is amorphous or substantially amorphous.

16. The coated article of claim 1, wherein the first IR reflecting layer comprises silver.

17. The coated article of claim 1, wherein the coating further comprises a layer comprising silicon nitride located between the glass substrate and the first high index dielectric layer.

18. The coated article of claim 1, wherein the coated article is thermally tempered.

19. The coated article of claim 1, wherein the coated article has a visible transmission of at least 50%.

20. The coated article of claim 1, wherein the first contact layer comprises Ni and Cr.

21. The coated article of claim 1, wherein the coating further comprises:
    a third dielectric layer comprising zinc oxide on the glass substrate located over at least the a second high index dielectric layer comprising a nitride of Zr and Al;
    a second infrared (IR) reflecting layer on the glass substrate, located over and directly contacting the third dielectric layer comprising zinc oxide;
    a second contact layer on the glass substrate located over and directly contacting the second IR reflecting layer;
    a fourth dielectric layer comprising zinc oxide on the glass substrate located over and directly contacting the second contact layer;
    a third high index dielectric layer comprising a nitride of Zr and Al on the glass substrate located over and directly contacting the fourth dielectric layer comprising zinc oxide, wherein the third high index dielectric layer comprising the nitride of Zr and Al contains more Zr than Al; and wherein said another dielectric layer is located over at least the third high index dielectric layer.

* * * * *